Figure 1:
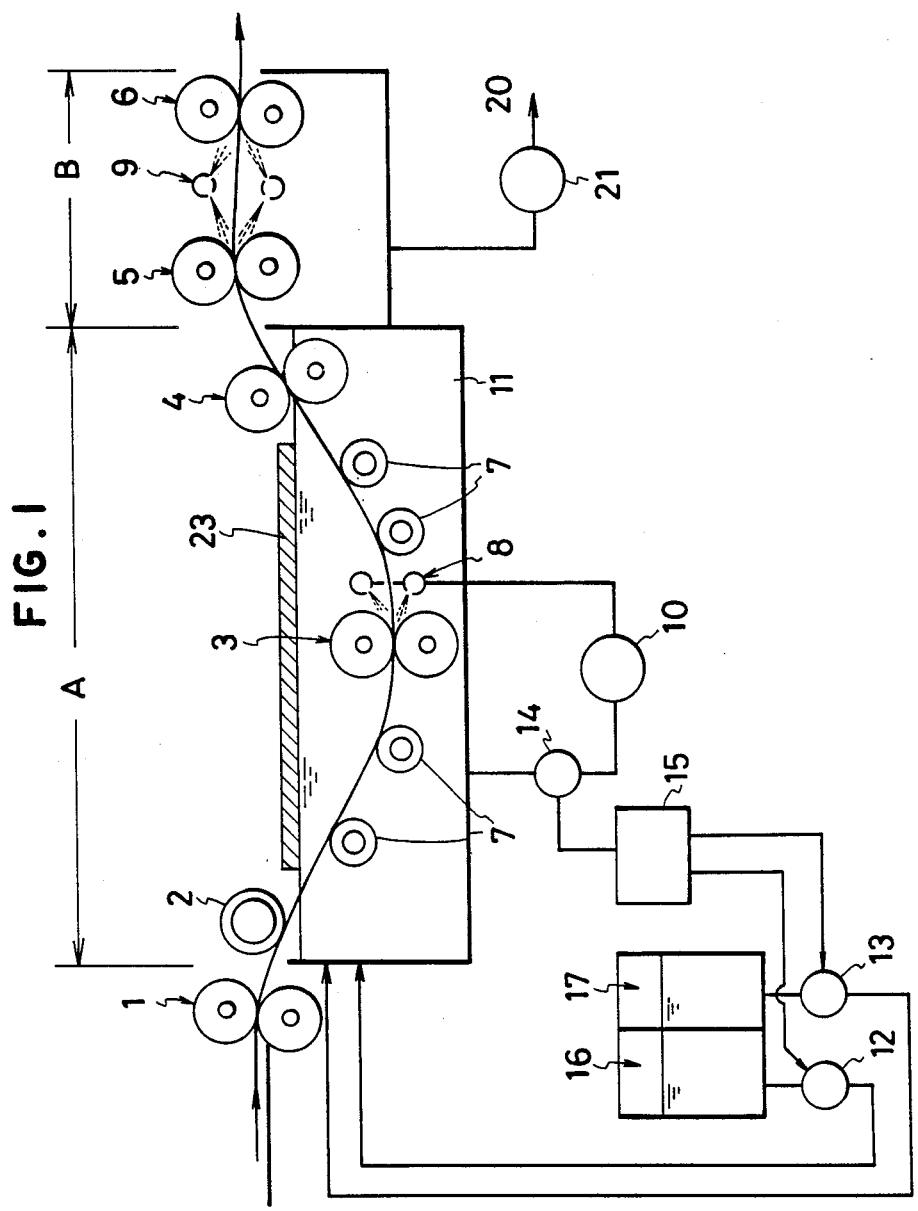

United States Patent [19]

Ohba et al.

[11] Patent Number: 4,882,246

[45] Date of Patent: Nov. 21, 1989

[54] METHOD FOR SUPPLEMENTING REPLENISHER FOR DEVELOPER IN AUTOMATIC DEVELOPING MACHINE FOR PRESENSITIZED PLATE

[75] Inventors: Hisao Ohba; Tomoaki Takekoshi; Kenji Kunichika, all of Shizuoka, Japan

[73] Assignee: Fuji Photo Film Co., Ltd., Ashigara, Japan

[21] Appl. No.: 218,892

[22] Filed: Jul. 14, 1988

[30] Foreign Application Priority Data

Jul. 17, 1987 [JP] Japan .................. 62-178457

[51] Int. Cl.$^4$ .............................................. G03C 5/00
[52] U.S. Cl. ..................................... 430/30; 430/302;
430/309; 430/331; 118/663; 354/299; 354/320;
354/324
[58] Field of Search .............. 156/626, 627; 430/301,
430/309, 326, 331, 193, 165, 190, 302, 189, 125;
354/325, 299, 317, 320, 324, 326, 318, 319;
118/119, 325, 326, 601, 624, 663, 665; 355/10,
300, 14 D, 14 R

[56] References Cited

U.S. PATENT DOCUMENTS

| 4,259,434 | 3/1981 | Yamasue et al. | 430/331 |
| 4,452,880 | 6/1984 | Seino et al. | 430/331 |
| 4,469,776 | 9/1984 | Matsumoto et al. | 430/331 |
| 4,537,496 | 8/1985 | Ohba et al. | 430/300 |
| 4,737,810 | 4/1988 | Kobayashi et al. | 354/325 |

FOREIGN PATENT DOCUMENTS

| 84097 | 7/1983 | European Pat. Off. |  |
| 107454 | 5/1984 | European Pat. Off. |  |
| 0114402 | 8/1984 | European Pat. Off. |  |
| 0194447 | 2/1985 | Japan | 430/30 |
| 0156063 | 8/1985 | Japan | 430/30 |
| 60-156063 | 8/1985 | Japan |  |
| 0166950 | 8/1985 | Japan | 430/30 |
| 61-61164 | 3/1986 | Japan |  |

Primary Examiner—Jose G. Dees
Assistant Examiner—Donald J. Loney
Attorney, Agent, or Firm—Burns, Doane, Swecker & Mathis

[57] ABSTRACT

A method for supplementing a replenisher for developer which comprises developing a large number of PS plates imagewise exposed to light with a developer composed of an aqueous solution containing electrolytes in an automatic developing machine, characterized by determining an AC impedance of the developer contained in the automatic developing machine, obtaining a correction impedance from the measured impedance value and rate of replacement and supplementing a desired amount of the replenisher to the developer when the correction impedance reaches a predetermined value. This method makes it possible to maintain a desired activity of the developer even when a large number of PS plates are processed and to relax the restriction on the incorporation of optional devices such as an autofeeder into the automatic developing machine.

14 Claims, 1 Drawing Sheet

METHOD FOR SUPPLEMENTING REPLENISHER FOR DEVELOPER IN AUTOMATIC DEVELOPING MACHINE FOR PRESENSITIZED PLATE

BACKGROUND OF THE INVENTION

1. Field of the Invention

The present invention relates to a method for development-processing a presensitized plate for use in making a lithographic printing plate (hereinafter optionally referred to as "PS plate(s)") and more particularly to a method for maintaining a constant activity of a developer during development-processing by supplementing a replenisher for developer.

2. Description of the Prior Art

It has been known to recover a developer deteriorated by developing a large number of PS plates through the addition of a replenisher therefor.

For instance, Japanese Patent Un-examined Publication (hereinafter referred to as "J.P. KOKAI") No. 56-115039 (British Pat. No. 2,046,931) discloses such a technique which permits a long-term running development by replenishment for compensating the deterioration of the developer by carbon dioxide in the air and by replenishment for compensating the deterioration of the developer by development of PS plates; J.P. KOKAI No. 58-95349 (U.S. Pat. No. 4,537,496) discloses a technique which comprises disposing a sensor in the middle of a developing zone of an automatic developing machine, monitoring the degree of light-sensitive compositions dissolved out from the processed PS plates, and automatically operating a device for supplementing a replenisher for developer when the degree of light-sensitive composition dissolved out, which is detected by the sensor, is reduced to a desired level so that a desired amount of the replenisher for developer is supplemented to the automatic developing machine; and J.P. KOKAI No. 61-61164 discloses a technique comprising determining the electric conductivity of a developer and operating an apparatus for supplementing a replenisher for developer when the level of the electric conductivity thereof is lowered to a predetermined level as the amount of the materials processed is increased so that a desired amount of the replenisher for developer is supplemented to a developing bath.

However, in the technique disclosed in J.P. KOKAI No. 56-115039 (British Pat. No. 2,046,931), a constant amount of the replenisher is always supplemented if the PS plates processed have a constant length irrespective of the change in the width and image areas thereof. Moreover, a constant amount of replenisher for developer is also supplemented in the case of replenishment for compensating the deterioration of the developer by carbon dioxide in the air. However, the optimum amount of the replenisher is greatly influenced by the amount of the developer initially charged into an automatic developing machine and the concentration of carbon dioxide present in the air.

As explained above in detail, the aforementioned conventional techniques suffer from drawbacks such that the precise recovery of the deteriorated developer cannot be attained unless the amount of the replenisher is changed at each time while taking, into consideration, various factors such as the width of PS plates, image areas thereof, the amount of the developer initially charged into the automatic developing machine and the concentration of carbon dioxide in the air.

Under such circumstances, many attempts have been directed to the development of methods which makes it possible to eliminate the foregoing drawbacks. For instance, J.P. KOKAI No. 58-95349 (U.S. Pat. No. 4,537,496) cited above discloses a technique which gives lithographic printing plates having high stability and high quality. However, in this method, it is required to coincide nonimage areas of the PS plates with the position on which a sensor is disposed and further it is difficult to incorporate related devices such as an autofeeder into the automatic developing machine. In addition, J.P. KOKAI No. 61-61164 discloses a technique in which supplementation of the replenisher for developer is effected on the basis of the following empirical exponential function of the number of replenishment (X):

$$Z = 6.09 \times X^p$$

wherein Z is the lower limit of electric conductivity of a developer at which the supplementation of the replenisher is to be carried out; and p is a constant which is determined in accordance with the kind of light-sensitive layer of the PS plate to be processed. However, the electric conductivity of a developer or hence the lower limit thereof is influenced by various factors such as the kind of the light-sensitive layer processed (i.e., the foregoing factor p), the volume of tanks for the automatic developing machine, the charged amount of the developer, the amount of a replenisher supplemented, the concentration of $CO_2$ and evaporation of water and, therefore, the lower limit (Z) cannot be correctly determined simply by the number of replenishment (X). Therefore, a stable supplementation cannot be achieved by such a technique disclosed therein.

SUMMARY OF THE INVENTION

Accordingly, it is a principal purpose of the present invention to eliminate the disadvantages associated with the conventional techniques. More specifically, it is a purpose of the present invention to provide a method for supplementing a replenisher for developer, which makes it possible to maintain the activity of the developer almost identical to that of the fresh one during processing a large number of PS plates in an automatic developing machine and which also makes it possible to give stable development even when there are differences in the kinds of the PS plates to be processed and in the times elapsed after the PS plates have been prepared (storage time).

The inventors of this invention have conducted various studies to eliminate the aforementioned drawbacks and as a result, have found that the activity of the developer can be maintained at a level almost identical with that of the fresh one by supplementing a replenisher in accordance with the change in the alternating current (AC) impedance of the developer contained in an automatic developing machine and thus have succeeded to develop a method for stably supplementing a replenisher for developer, which is not influenced by factors such as the width of the PS plates processed, the image areas thereof, the concentration of $CO_2$, the volume of tanks, the amount of developer initially charged thereinto, the amount of a replenisher supplemented and the kinds of related devices incorporated into the automatic developing machine.

The foregoing and other purposes of the present invention can effectively be achieved by providing a method for supplementing a replenisher for developer which comprises developing a large number of PS plates imagewise exposed to light with a developer composed of an aqueous solution containing electrolytes in an automatic developing machine, characterized by determining an AC impedance of the developer contained in the automatic developing machine, obtaining a correction impedance from the measured value and the rate of replacement of the developer with the replenisher and supplementing a desired amount of the replenisher when the correction impedance reaches a predetermined value.

BRIEF EXPLANATION OF THE ACCOMPANYING DRAWING

The present invention will hereunder be explained in more detail with reference to the accompanying drawing, in which;

FIG. 1 is a cross sectional view schematically illustrating an example of the automatic developing machine used in the method of the present invention.

DETAILED EXPLANATION OF THE INVENTION

In the method of this invention, the AC impedance of a developer may be determined by using any known means therefor such as AC impedometer, AC impedance bridge and other impedometers.

The optimum conditions such as current for measuring such impedance and oscillation frequency of the devices therefor vary depending on various factors such as the composition of the developer, however, it is preferred that the current used be low in some degree from the viewpoint of miniaturizing or simplifying the device and preventing the water-soluble developing agent from being electrolyzed. For instance, it ranges from several microamperes to several hundreds milliamperes.

On the other hand, the frequency preferably ranges from several hundreds hertz to several hundreds kilohertz in taking the relation between the same and the electrostatic capacity of the developer into consideration.

The impedance value of the developer containing electrolytes generally varies depending on the temperature of the developer (aqueous solution) and it decreases as the temperature of the developer rises. Therefore, it is more preferred to determine the impedance value utilizing a device for measuring the same provided with a temperature sensor and a temperature compensation circuit.

In the means for measuring AC impedance, the sensor may be disposed on any position thereof so far as it is immersed in the developer at the time of measuring and the correct value thereof is certainly determined at that position. For instance, the sensor is preferably disposed within a developer circulating system, in particular within a tank for development or a pipe for circulating developer.

Moreover, as a detecting portion of the means for measuring AC impedance, a known cell may be used, in which platinum, stainless steel or the like is used as an electrode.

In general, the impedance value of the developer increases by the deterioration of the developer due to the processing of PS plates and that due to the increase in $CO_2$ concentration with the lapse of time. In the running development, the pH value of the developer can be maintained at a constant value by recovering the same through the repeated supplementation of the replenisher therefor. However, the impedance of the developer tends to decrease as the ratio of the amount of supplemented replenisher for developer to the initially charged amount of developer (rate of replacement; which will hereunder be defined more correctly) increases, this is because the impedance of the replenisher for developer currently used is low. Thus, the impedance value of the developer finally reaches the impedance value observed when the developer is completely replaced with the replenisher. The method of this invention is characterized by obtaining a correction impedance value by substituting the measured impedance value and the rate of replacement into a calculation equation previously obtained and supplementing the replenisher to the developing tank at the time when such a correction impedance calculated reaches a predetermined value.

In other words, the method of this invention is designed so that the measured impedance value is corrected in accordance with the calculation equation which is previously obtained on the basis of the amount of the replenisher and that the supplementation of the replenisher is commenced when the correction impedance reaches a predetermined value due to the deterioration of the developer. The calculation equation can be obtained empirically.

For instance, such a calculation equation may be obtained by plotting AC impedance values with respect to the rate of replacement obtained when the replenisher is supplemented to the developer so that the same solid step number or clear step number of a step tablet can always be obtained in processing a large number of PS plates to which the step tablet has been printed at the same exposure value. In the case of a developer for a positive-working PS plate wherein an aqueous solution of sodium silicate or potassium silicate is used as a developer, such a calculation equation is as follows:

$$Y = X - (-ax_n + b - c)$$

$$x_n = (x_{n-1} \cdot A + B)/(A + B)$$

$$x_o = 0$$

wherein $x_n$ represents the rate of replacement; Y is the correction impedance value; X is the measured impedance value; a denotes the slope of the rate of replacement of the replenisher to the impedance value $(b-c)$; b is the initial impedance value; c is the final impedance value (i.e., that observed when the developer initially charged into a tank for developer is completely replaced with the replenisher); A is the initial amount of the developer; B is the amount of the replenisher per supplementation; and n is the number of supplementation.

In this connection, it is preferred that the variables b and c be able to be changed automatically or manually depending on the kinds of developers and the change in the atmosphere (due to the change in the concentration of $CO_2$, evaporation of water or the like).

The automatic developing machine as used herein is one of the type in which PS plates are conveyed and whose developing zone is one of horizontal conveying type and which may be provided with a means for spraying the plate with a developer, brush and the like. In particular, those provided with a zone for dipping development are preferably used. These machines may optionally have a water washing zone (inclusive of zone for circulating water in a reservoir), a rinsing zone, a desensitization zone and/or a drying zone. The preferred device for supplementing a replenisher for developer comprises a combination of a tank for the replenisher and a solution supplying pump into which a timer is incorporated or a combination of a tank for the replenisher, a D/A converter and a microcomputer into which a variety of programs to which various information concerning the PS plates to be processed, developers, and replenishers for developer are incorporated.

In a more preferred embodiment of the present invention, water is continuously or periodically added to the developer in the amount comparable to that evaporated from the developer with the lapse of time in conjunction with the supplementation of the replenisher as explained above, which makes the running time more longer.

The supplementation of water for compensating the amount thereof corresponding to that evaporated from the developer can be carried out, for instance, by previously estimating, experimentally, the amount of water evaporated from the developer, which has been charged into an automatic processing machine, while running it under the environment where the machine is installed and continuously or intermittently supplementing water in the amount comparable to that evaporated, automatically or manually on the basis of such estimation.

In general, the amount of water evaporated from the developer varies depending on various factors such as the kinds of automatic developing machine used, the environment where it is installed (e.g., temperature, humidity and air flow rate), the operation conditions of the machine (e.g., temperature of the developer and speed for conveying PS plates processed). Thus, the amount of water evaporated off with the lapse of time can automatically be obtained if it is previously determined under every such conditions experimentally. Therefore, the supplementation of water for compensating that evaporated from the developer can be carried out by adding a desired amount of water at appropriate time, for instance, at a predetermined constant time interval or at any time when the amount of water evaporated reaches a predetermined level. The integration of the amount of water evaporated off can automatically be effected by, for instance, simply determining temperature and/or humidity if the information such as the change of the amount of water evaporated with time under various temperature and humidity previously estimated is fed to a computer.

The amount of water evaporated from the developer can also be determined by using a physicochemical detector such as a gravimeter, a level meter, a photometer and a spectrophotometer. In this case, the supplementation of water in an amount comparable to that evaporated off can automatically or manually be carried out by experimentally determining the relation between the amount of water evaporated and the value detected by such a physicochemical detector previously. If a gravimeter is used, the relation between the specific gravity of the developer and the amount of water evaporated is experimentally determined previously and a constant amount of water is intermittently supplemented at a time when the specific gravity reaches a predetermined value. In this respect, if the specific gravity of the replenisher for developer is greater than that of the developer, it is not possible to distinguish the increase thereof due to evaporation of water from that due to the supplementation of the replenisher. However, the increase in the specific gravity due to evaporation can be obtained if the information on the increase in the specific gravity of the developer due to the addition of the replenisher is fed to, for instance, a microcomputer. It is also possible to apply a similar concept in the case where there is a change in the specific gravity resulting from the processing of PS plates. Thus, in these cases, the addition of water for compensating that evaporated can be effected in the same manner as explained above.

The same concept can likewise be applied to cases where other type of physicochemical detectors are used.

The PS plates processed by the method of this invention comprises a substrate such as an aluminum plate, a zinc plate, an iron plate, a chrome plated iron plate, paper, and a plastic plate, and alight-sensitive layer applied to the substrate in an amount of 0.05 to 5 g/m$^2$ (amount weighed after drying), the light-sensitive layer causing the solubility change in the developer when exposed to light. The light-sensitive layer comprises light-sensitive materials such as o-naphthoquinonediazide compounds, diazonium salts, azide compounds, photopolymerizable compounds and photocrosslinkable compounds; and optionally an alkali-soluble binder.

The light-sensitive plates particularly suitable for the method for supplementing a replenisher of this invention are positive-working PS plates composed of an aluminum plate provided thereon with a light-sensitive layer of o-quinonediazide compounds, which are described in U.S. Pat. No. 4,259,434, col. 3, line 2 from the bottom to col. 6, line 14.

Any developers may be used in this invention so far as they can easily dissolve out or remove the light-sensitive layer of the light-sensitive plate. If the light-sensitive layer comprises o-quinonediazide compounds, aqueous solutions of sodium silicate or potassium silicate can be used as a developer, which are, for instance, disclosed in J.P. KOKAI Nos. 54-62004, 55-22759, 55-115045 and 57-54938 (U.S. Pat. Nos. 4,259,434 and 4,469,776, British Pat. No. 2,046,931 and International Patent Publication No. WO 82/01086). The replenishers used in such cases are preferably strong developers having an alkali concentration higher than that of the original developer as disclosed in J.P. KOKAI Nos. 50-144502, 54-62004 and 55-22759 (U.S. Pat. No. 4,259,434, British Pat. No. 2,046,931 and International Patent Publication No. WO 82/01086). The amount thereof replenished varies depending on the strength of the replenisher to be supplemented, however, the amount thereof per each supplementation preferably ranges from 5 ml to 5 liters per 20 liters of the initially charged amount of the developer from the viewpoint of easy quality control of the developer. The optimum control can be achieved by adjusting the amount of the replenisher to be supplemented to 20 ml to 2 liters per 20 liters of the initially charged amount of the developer.

If negative-working light-sensitive layers composed of negative-working diazonium compounds which are hardened when it is exposed to light are processed by the method of this invention, the composition of the developer used widely varies in accordance with the kinds of binder used in the light-sensitive layer. For instance, if an alkaline-soluble resin is used as a binder, the principal component of the developer is an alkaline agent as described in J.P. KOKAI Nos. 50-21601, 53-44202 (U.S. Pat. No. 4,186,006) and 57-192951. Such an alkaline agent is consumed as the PS plates are processed and, therefore, the activity of the developer is thereby gradually lowered. In such a case, the activity of the developer can be recovered by the addition of an alkaline solution as the replenisher for developer. Moreover, if other light-sensitive plates comprised of azide type compounds, photocrosslinkable compounds or photopolymerizable compounds are processed with the corresponding developers respectively, the components of the developer, consumed during processing, are supplemented to recover the activity of the developers.

In any case, the AC impedance of the developer in the automatic developing machine is determined, a correction impedance is calculated by substituting the measured impedance value and the rate of replacement into a previously obtained calculation equation and the replenisher for the developer is supplemented when the correction impedance value reaches a predetermined reference value as the developer is deteriorated. From the viewpoint of easy operation, it is preferred to supplement the stock solution of replenisher for developer and water as a diluent separately.

As discussed above in detail, the present invention is very effective when a large number of PS plates are processed using an automatic developing machine. The present invention makes it possible to maintain high activity of the developer compared with the conventional methods. In addition, the present invention can surely relax the restriction on the incorporation of other related devices into the automatic developing machine.

The present invention will hereunder be explained in more detail with reference to the following non-limitative working Examples. Moreover, effects practically achieved by the method of this invention will also be discussed in comparison to Comparative Examples.

EXAMPLE 1

A light-sensitive solution was prepared by dissolving 1 part by weight of polyhydroxyphenyl naphthoquinone-1,2-diazido-5-sulfonate obtained by polycondensing acetone with pyrogallol as described in Example 1 of U.S. Pat. No. 3,635,709, 2 parts by weight of novolak type phenolformaldehyde resin and 0.02 parts by weight of Crystal Violet into a mixture comprised of 20 parts by weight of ethylene glycol monomethyl ether acetate, 10 parts by weight of ethylene glycol monomethyl ether and 10 parts by weight of methyl ethyl ketone. A grained aluminum plate having 0.3 mm in thickness was anodized in sulfuric acid solution to form about 2.4 g/m² of an oxidized film thereon followed by sufficiently washing and then drying. A light-sensitive plate was prepared by applying the foregoing light-sensitive solution onto the surface of the aluminum plate and then drying the same to obtain a light-sensitive layer thereon in a coated amount of about 2.5 g/m².

The positive-working light-sensitive plate thus prepared was exposed, through a positive transparency for 60 seconds, to light of 3 kW metal halide lamp at a distance of 1 m. The plate thus exposed to light was developed using an automatic developing machine provided with a developing zone as shown in FIG. 1.

In a tank for development 11, there was charged 16 liters of a developer consisting of 30% by weight of aqueous solution of potassium silicate ($SiO_2/K_2O = 1.24$). The discharging amount of pumps 12 and 13 were controlled so that a replenisher for developer in a tank 17 therefor was diluted with water from a replenishing tank 16 to form an aqueous solution of potassium silicate ($SiO_2/K_2O = 1.24$) having a concentration of 6.5% by weight. A sensor 14 for detecting impedance of the developer was disposed in a circulating system for spraying the plate with and circulating the developer in the tank 11 therefor through a spraying pipe 8 by the action of a pump 10. Then, a correction impedance Y was obtained by substituting the impedance value X detected by the sensor 14 into the following calculation equation through a controller 15. In this connection, the reference value of the correction impedance Y was set at the value 0.5 ohm·cm higher than the final impedance value c (in other words, 15.5 ohm·cm), i.e., the machine was designed so that 500 cc of the replenisher for developer as a whole was supplemented to the developer by the action of the pumps 12 and 13 when the correction impedance reached 15.5 ohm·cm or more.

$$Y = X - (-ax_n + b - c)$$
$$= X - (-6x_n + 6)$$
$$x_n = (x_{n-1} \times 16 + 0.5)/(16 + 0.5)$$
$$x_o = 0$$

b = 21 ohm.cm
c = 15 ohm.cm
a = 21 − 15 = 6

Plates having a size of 1003 mm × 800 mm were processed for one month in the manner as explained above. As a result, it was found that the lithographic printing plates exhibiting stable reproduction of half-tone dots were produced even after processing of 2,000 plates.

COMPARATIVE EXAMPLE 1

Utilizing the same apparatus as in Example 1, the same plates were processed in the same manner as in Example 1 except that the correction of the AC impedance value was not carried out, in other words the impedance value at which the supplementation of the replenisher was effected was fixed at the initial impedance value b. 100 Plates having a size of 1003 mm × 800 mm were processed. However, only lithographic printing plates having poor reproduction of half-tone dots and causing background contaminations on printed matters were produced.

EXAMPLE 2

Plates having a size of 1003 mm × 800 mm were processed for one month in the same manner as in Example 1 except that the developer used was 3.0% by weight of aqueous solution of potassium silicate ($SiO_2/K_2O = 0.9$); the replenisher for developer was an aqueous solution (concentration = 3.6% by weight) of potassium silicate ($SiO_2K_2O = 0.4$) having an impedance value lower than that of the foregoing developer; and the initial impedance value b and the final impedance value c were changed to 17 ohm·cm and 14 ohm·cm respectively. Even after processing of 2,500 plates, lithographic printing plates exhibiting stable reproduction of half-tone dots were obtained.

EXAMPLE 3

Development processing of PS plates were carried out according in the similar manner as in Example 1 except that the supplementation of water for compensating that evaporated from the developer was effected as follows:

The amount of water evaporated was experimentally determined on the basis of the temperature and relative humidity (25° C. and 50% respectively) of the room where an automatic developing machine was installed and it was determined to be 50 ml of water per hour during operating the machine and 10 ml of water per hour during stopping the same, which were fed to a controller 15. Water was practically added to the developer by operating a pump 12 in an amount of 200 ml at intervals of four hours during the operation and 40 ml at intervals of four hours during stopping.

Plates having a size of 1003 mm × 800 mm were processed for about 6 months as explained above. Even after processing of 12,000 plates, lithographic printing plates exhibiting stable reproduction of half-tone dots were obtained.

What is claimed is:

1. A method for supplementing a replenisher for developer which comprises developing a large number of presensitized plates for use in making lithographic printing plates, which have been imagewise exposed to light, with a developer comprising an aqueous solution of sodium silicate or potassium silicate in an automatic developing machine, comprising the steps of determining an AC impedance of the developer contained in the automatic developing machine, obtaining a correction impedance from the measured impedance value and rate of replacement and supplementing a desired amount of the replenisher to the developer when the correction impedance reaches a predetermined value, wherein the correction impedance is determined by substituting the measured impedance and a rate of replacement into a predetermined calculation equation as follows:

$$Y = X - (-ax_n + b - c)$$

$$x_n = (x_{n-1} \cdot A + B)/(A + B)$$

$$x_0 = 0$$

wherein $x_n$ represents the rate of replacement; Y is the correction impedance value; X is the measured impedance value; a denotes the slope of the rate of replacement to the impedance value (b−c); b is an initial impedance value of the developer; c is the final impedance value thereof; A is the initial amount of the developer; B is the amount of the replenisher per supplementation; and n is the number of supplementation.

2. A method of claim 1 wherein the AC impedance of the developer is measured at a current ranging from several microamperes to several hundreds milliamperes.

3. A method of claim 1 wherein the AC impedance of the developer is measured at an oscillation frequency ranging from several hundreds hertz to several hundreds kilohertz.

4. A method of claim 1 wherein the AC impedance of the developer is measured with a device for determining impedance which is provided with a temperature sensor and a temperature compensation circuit.

5. A method of claim 1 wherein a sensor of a means for determining the AC impedance of the developer is disposed within a tank for developer or a pipe for circulating the developer.

6. A method of claim 1, wherein the predetermined calculation equation is obtained by plotting AC impedance values with respect to rate of replacement obtained when the replenisher is supplemented to the developer so that the same solid step number or clear number of a step tablet can always be obtained in processing a large number of presensitized plates to which the step tablet is printed at the same exposure value.

7. A method of claim 1 wherein the automatic developing machine is one of the type provided with a dipping development zone and optionally a washing zone, a rinsing zone, a desensitization zone and/or a drying zone.

8. A method of claim 1 wherein the replenisher is supplemented by a device for supplementing the same which comprises a tank therefor and a replenisher circulating pump with a built-in timer or a combination of a microcomputor and an A/D converter.

9. A method of claim 1 wherein the amount of the replenisher per supplementation ranges from 5 ml to 5 liters per 20 liters of the initially charged developer.

10. A method of claim 1 wherein the supplementation of the replenisher is carried out by supplementing a concentrated stock solution for replenisher and water separately.

11. A method of claim 1 wherein a light-sensitive layer of the presensitized plate comprises o-naphthoquinonediazide compounds, diazonium salts, azide compounds, photopolymerizable compounds or photocrosslinkable compounds and optionally an alkaline-soluble binder.

12. A method of claim 11 wherein the presensitized plate is a positive-working presensitized plate comprising an aluminum plate and a light-sensitive layer of o-quinonediazide compounds applied to the surface of the aluminum plate.

13. A method of claim 1 wherein water is added to the developer in an amount comparable to that evaporated of from the developer, in conjunction with the supplementation of the replenisher therefor.

14. A method of claim 12, wherein both of the developer and the replenisher comprise an aqueous solution of sodium silicate or potassium silicate and wherein the replenisher has an alkalinity higher than that of the developer.

* * * * *